Oct. 4, 1966 H. OCKER 3,277,406
TUNER WITH PARTICULARLY LOCATED COUPLING BETWEEN HALF-WAVELENGTH TANK CIRCUIT AND ANOTHER CIRCUIT
Filed July 13, 1964 2 Sheets-Sheet 1
Fig. 1
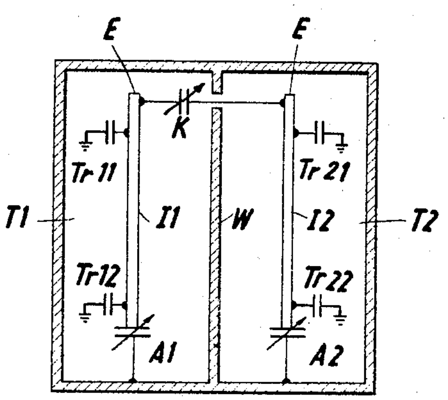
Fig. 2
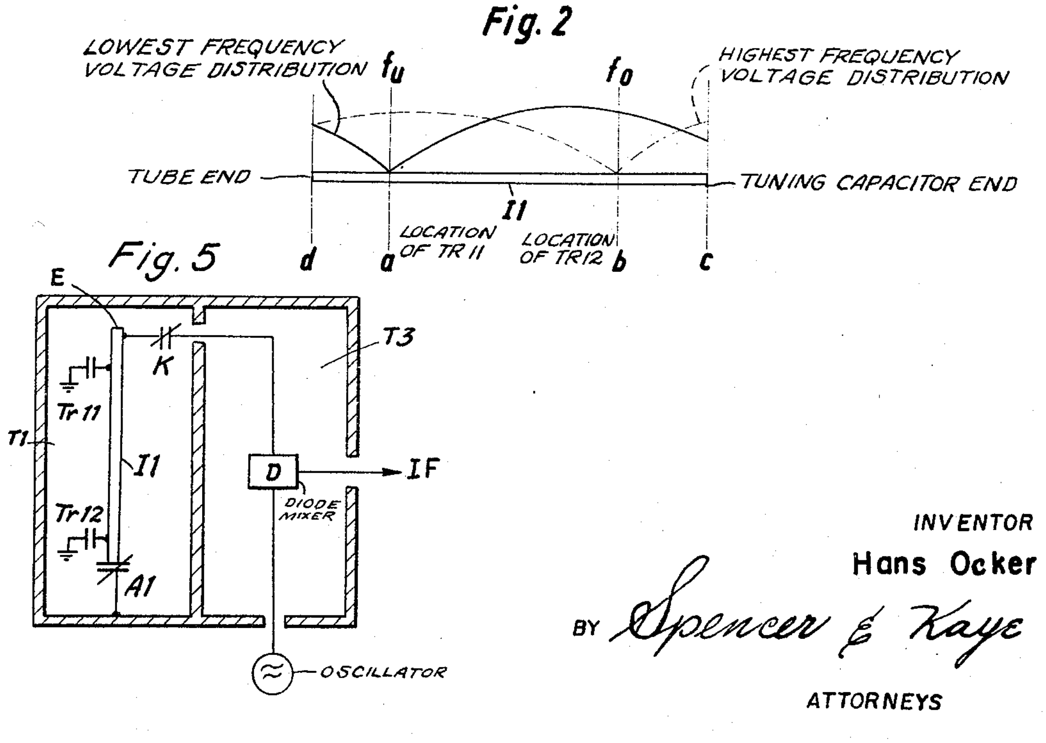
Fig. 2, Fig. 5
INVENTOR
Hans Ocker
BY Spencer & Kaye
ATTORNEYS Oct. 4, 1966 H. OCKER 3,277,406

TUNER WITH PARTICULARLY LOCATED COUPLING BETWEEN HALF-WAVELENGTH TANK CIRCUIT AND ANOTHER CIRCUIT

Filed July 13, 1964 2 Sheets-Sheet 2

INVENTOR
Hans Ocker

BY *Spencer & Kaye*

ATTORNEYS

United States Patent Office 3,277,406
Patented Oct. 4, 1966

3,277,406

TUNER WITH PARTICULARLY LOCATED COUPLING BETWEEN HALF-WAVELENGTH TANK CIRCUIT AND ANOTHER CIRCUIT

Hans Ocker, Ulm (Danube), Germany, assignor to Telefunken Patentverwertungsgesellschaft m.b.H., Ulm (Danube), Germany Filed July 13, 1964, Ser. No. 381,952
Claims priority, application Germany, July 24, 1963, T 24,354
17 Claims. (Cl. 333—73)

The present invention relates to a tuner for a superheterodyne receiver capable of receiving electromagnetic waves in the UHF (ultra high frequency) range, which tuner has at least one half-wavelength ($\lambda/2$) tank circuit that is geometrically shortened, at one end, by means of a vacuum tube and/or the circuit capacitance and, at the other end, by the tuning capacitor, there being two trimmer capacitors which are connected, respectively, at each of the points of the inner conductor or line at which voltage nodes occur at the highest and lowest frequencies of the frequency range through which the tuner is to be tuned.

Tuners of the above type find particular application in television receivers. There exist various ways in which the individual tank circuits may be coupled to each other, or in which the tank circuit may be coupled to a mixer connected to the tuner. The coupling should be such that the band width remains as constant as possible—i.e., changes as little as possible—throughout the tuning range.

One phenomenon incident to tuners of this type is that, as the tuner is tuned, the potential nodes and current antinodes of a capacitatively tuned half-wavelength tank circuit move along the length of the inner conductor, as a result of which the coupling factor, and hence the band width, is dependent on the particular frequency to which the tuner is tuned.

One way to avoid this drawback is to use a two-point coupling arrangement which allows individual adjustment of the coupling. But one very significant drawback of such a two-point coupling is that it becomes very difficult and time-consuming to align the tuner, and this problem becomes aggravated when the tuner is mass-produced on the assembly line.

Another approach to the problem has been to couple a half-wavelength tank circuit inductively, with the coupling loop being so shaped and arranged that the current antinodes moving along the inner conductor are picked up in the plane of the loop over the entire range through which the tuner is to be tuned. But this requires the coupling loop to be appropriately bent to obtain the desired coupling effect and this, too, is exceedingly time-consuming, so much so that this technique has not lent itself to mass production situations.

There also exist band filter couplings which use punched-out slits in the common separating wall between the two half-wavelength tank circuits. These have the disadvantage that no individual coupling can be effected, which, in turn, makes it impossible to obtain optimum power amplification of such a tuner (UHF tuner).

It is, therefore, the primary object of the present invention to provide a coupling which avoids the above drawbacks, but which nonetheless retains the essential electrical characteristics.

With the above objects in view, the present invention resides, basically, in a tuner of the above type in which the coupling means which couple the tank circuit to another tank circuit, or to a mixer are connected between one of the trimmer capacitors and the tuning capacitor, or between the vacuum tube end of the inner conductor and the other trimmer capacitor.

More particularly, the present invention resides in a tuner arrangement tunable throughout a given frequency range, which tuner arrangement comprises at least one half-wavelength tank circuit having an inner conductor. The inner conductor has first and second ends, with the first end being geometrically shortened by the circuit capacitance, there being a potential node at a first point along the length of the inner conductor when the tuner arrangement is tuned to the lowest frequency of the given range and there being a further potential node at a second point along the length of the inner conductor when the tuner arrangement is tuned to the highest frequency of this range. A tuning capacitor is connected to the second end of the inner conductor and geometrically shortens the same; a first trimmer capacitor is connected to the inner conductor at the first nodal point thereof, and a second trimmer capacitor is connected to the inner conductor at the second nodal point thereof. Finally, coupling means are provided for coupling the tank circuit to another component, which may, for example, be another tank circuit or a mixer, these coupling means being electrically associated with the inner conductor at a point along its length which is outside of the region between the first and second nodal points thereof.

The coupling means are constituted by a capacitor, preferably a variable capacitor, or by a coupling loop, or by a coupling window which is provided in a wall common to the tank circuit and the other component. For close coupling, the coupling means may be connected directly to one of the ends of the inner conductor, preferably the mentioned first end thereof which is geometrically shortened by the circuit capacitance.

Additional objects and advantages of the present invention will become apparent upon consideration of the following description when taken in conjunction with the accompanying drawings in which:

FIGURE 1 is a schematic showing of a tuner having a tank circuit equipped with coupling means connected according to the present invention.

FIGURE 2 shows the potential distribution at the two extremes of the tuning range.

FIGURE 5 shows another modification of a tuner incorporating a coupling arrangement according to the present invention.

Figure 3:
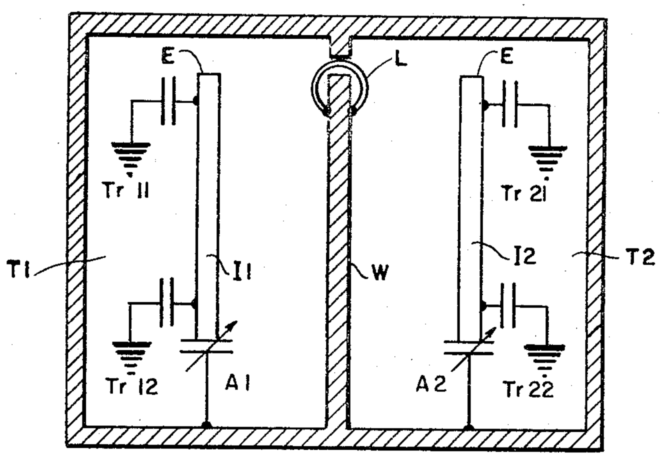
FIGURES 3 and 4 show modifications of a tuner incorporating a coupling arrangement according to the present invention.

Referring now to the drawings and to FIGURE 1 thereof in particular, the same shows a tuner incorporating two coupled together half-wavelength tank circuits, the left one, as viewed in FIGURE 1, being indicated at T1 and the right one at T2. Each tank circuit has a respective inner conductor I1 and I2, the same having connected thereto trimmer capacitors **T*r*11, T*r*12; T*r*21, T*r*22**. Each tank circuit is geometrically shortened at its tube end E by means of the tube and/or circuit capacitance, and at its other end by means of a tuning capacitor A1, A2. Also shown is the coupling element K by means of which the second tank circuit T2 is coupled to the first tank circuit T1. In the illustrated embodiment, the coupling element is constituted by a variable capacitor one of whose leads passes through an opening with which the wall W—this being the wall common to the two tank circuits—is provided.

According to the present invention, the coupling element is connected to the respective inner conductors at respective points thereon which are between the tube end E and the points at which the respective trimmer capacitors **T*r*11 and T*r*21** are connected.

Alternatively, the coupling means may be constituted by a coupling loop L according to FIG. 3.

Figure 4:
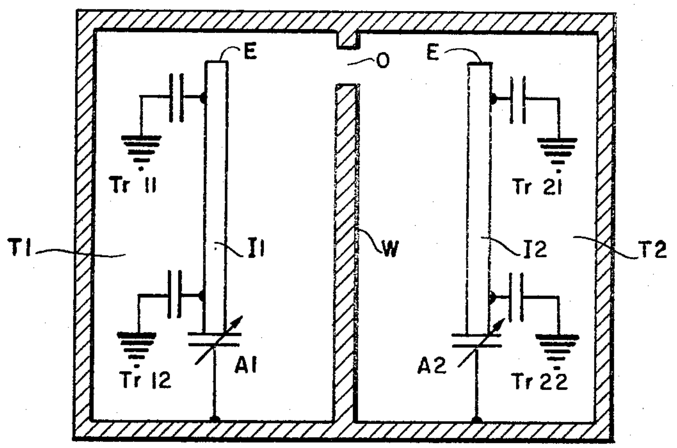

As yet another alternative, the coupling means may be constituted by a suitably dimensioned opening 0 or "window" which is provided in the common wall W between the two tank circuits T1 and T2 according to FIG. 4.

If the tuner consists of a tank circuit and a mixer, the tank circuit can be coupled to the mixer in a similar manner, as is shown in FIGURE 5 wherein the tank circuit is connected to one input of a diode mixer D having its other input connected to an oscillator and its output connected to supply IF to a further circuit, mixer D being disposed in enclosure T3. This means that the coupling arrangement according to the present invention can be used to couple the tank circuit to any other suitable component, be it another tank circuit or a mixer.

FIGURE 2 shows the voltage distribution of a capacitatively tunable half-wavelength tank circuit, and illustrates two distinct potential curves plotted as a function of the length of the inner conductor I1. The solid curve represents the voltage distribution when the tuner is tuned to the lowest frequency $f_u$ of the range throughout which the tuner is to be tunable, and shows that a potential node is formed at point *a* along the length of the inner conductor. The dashed line shows the voltage distribution when the tuner is tuned to the highest frequency $f_o$ of the given range, the potential node here appearing at point *b*. Conventionally, a trimmer capacitor is connected to the inner conductor at each of the nodal points *a* and *b*. In the tuner shown in FIGURE 1, the trimmer capacitor T*r*11 of the first tank circuit T1 is connected to the potential node of the lower limit frequency of the band and fixes the upper limit frequency. Similarly, the trimmer capacitor T*r*12 is connected to the potential node of the upper limit frequency and fixes the lower limit frequency. The voltage distribution extends beyond the points *a* and *b* toward the respective ends *d*, *c*, i.e., the tube end E and the tuning capacitor end of the inner conductor. Since, in accordance with the present invention, the coupling element for the tank circuit is connected to the inner conductor between *a* and *d*, or between *b* and *c*, that is to say, at a point along the length of the inner conductor which is outside of the region between the two nodal points, the displacement of the nodal point during the tuning will have but negligible effect on the coupling factor. The reason for this is that the tank circuit is greatly shortened on both sides by the capacitative loading of the tube or lead capacitance—hereinafter referred to, collectively or individually, as the circuit capacitance, and by the capacitance of the tuning capacitor. Thus, if the coupling element is a loop connected between *a* and *d*, or between *b* and *c*, such loop may be kept very small, as a result of which the coupling loop can be calibrated—that is to say, the tuner can be aligned, very easily and very quickly.

The following is an illustrative example of a tuner according to the present invention: if the frequency range throughout which the tuner is to be tuned is a band between 470 and 860 megacycles, the inner conductor will have a length of 40 mm. Points *a* and *b* will be spaced approximately 40 mm. and 10 mm., respectively from the ends, to which the tube is coupled. The coupling is connected at a point spaced 33 mm. from point *a*.

While, as stated above, the coupling means can be connected either between *a* and *d*, or between *b* and *c*, it is, from a practical point of view, more expedient if the connection is made between *a* and *d*, i.e., near the tube end of the conductor since here the geometric shortening is greater than at the end of the tuning capacitor.

If a very close coupling is needed, the coupling element may be connected directly to the end *d* or *c* of the inner conductor I1.

Thanks to the above coupling arrangement, the disadvantages set forth in the introduction, namely, the problems incident to production line alignment of tuners intended for superheterodyne receivers for very short electromagnetic waves, are avoided.

It will be understood that the above description of the present invention is susceptible to various modifications, changes and adaptations, and the same are intended to be comprehended within the meaning and range of equivalents of the appended claims.

What is claimed is:

1. A tuner arrangement tunable throughout a given frequency range and comprising, in combination:

(a) at least one half-wavelength tank circuit having an inner conductor, said inner conductor having first and second ends with said first end being geometrically shortened by circuit capacitance, there being a potential node at a first point along the length of said inner conductor when the tuner arrangement is tuned to the lowest frequency of said range and there being a further potential node at a second point along the length of said inner conductor when the tuner arrangement is tuned to the highest frequency of said range;

(b) a tuning capacitor conected to said second end of said inner conductor and geometrically shortening the same;

(c) a first trimmer capacitor connected to said inner conductor at said first nodal point thereof;

(d) a second trimmer capacitor connected to said inner conductor at said second nodal point thereof; and (e) coupling means for coupling said tank circuit to another component, said coupling means being electrically associated with said inner conductor at a point along its length which is outside of the region between said first and second nodal points thereof.

2. A tuner arrangement as defined in claim 1 wherein said coupling means are connected between said first end of said inner conductor and the nearer one of said two modal points.

3. A tuner arangement as defined in claim 1 wherein said coupling means are connected between said second end of said inner conductor and the nearer one of said two nodal points.

4. A tuner arrangement as defined in claim 1 wherein said coupling means are connected to said inner conductor at one of said two ends thereof.

5. A tuner arrangement as defined in claim 4 wherein said coupling means are connected to said first end of said inner conductor.

6. A tuner arrangement as defined in claim 4 wherein said coupling means are connected to said second end of said inner conductor.

7. A tuner arrangement as defined in claim 1 wherein said coupling means comprise a capacitor connected to said inner conductor.

8. A tuner arrangement as defined in claim 7 wherein said coupling capacitor is an adjustable capacitor.

9. A tuner arrangement as defined in claim 1 wherein said coupling means comprise a coupling loop.

10. A tuner arrangement as defined in claim 1 wherein said coupling means comprise a coupling window provided in a wall common to said tank circuit and said other component.

11. A tuner arrangement as defined in claim 1 wherein said other component is a further tank circuit.

12. A tuner arrangement as defined in claim 1 wherein said other component is a mixer.

13. In a tuner comprising at least one half-wavelength tank circuit which is geometrically shortened by the tube or circuit capacitance and by the tuning capacitor and in which respective trimmer capacitors are connected at those points of the inner conductor at which the voltage nodes are formed at the lowest and highest tuned frequency, the improvement that the coupling element needed for coupling said tank circuit to another circuit is arranged between one of the trimmer capacitors and that end of the inner conductor which is nearest that trimmer capacitor.

14. An arrangement as defined in claim 13 wherein the coupling element is arranged for coupling said tank circuit to another tank circuit.

15. An arrangement as defined in claim 13 wherein the coupling element is arranged for coupling said tank circuit to a mixer.

16. An arrangement as defined in claim 13 wherein the coupling element is arranged between one of the trimmer capacitors and that end of the inner conductor to which the tuning capacitor is connected.

17. An arrangement as defined in claim 13 wherein the coupling element is arranged between one of the trimmer capacitors and the tube end of the inner conductor.

References Cited by the Examiner

UNITED STATES PATENTS

| | | | |
|---|---|---|---|
| 2,795,693 | 6/1957 | Fisher et al. | 334—43 X |
| 2,824,965 | 2/1958 | Chalmers | 334—43 |
| 3,008,103 | 11/1961 | Maurer et al. | 333—73 X |
| 3,159,803 | 12/1964 | Czubiak et al. | 333—83 |
| 3,204,198 | 8/1965 | Bachnick | 331—101 |

HERMAN KARL SAALBACH, *Primary Examiner.*

R. F. HUNT, *Assistant Examiner.*